US010537032B2

(12) United States Patent
Ran

(10) Patent No.: US 10,537,032 B2
(45) Date of Patent: Jan. 14, 2020

(54) MOUNTING STRUCTURE FOR DISPLAY SCREEN

(71) Applicant: Qijie Ran, Beijing (CN)

(72) Inventor: Qijie Ran, Beijing (CN)

(73) Assignee: Ming Huang, Beijing (CN)

( * ) Notice: Subject to any disclaimer, the term of this patent is extended or adjusted under 35 U.S.C. 154(b) by 628 days.

(21) Appl. No.: 15/028,397

(22) PCT Filed: Apr. 20, 2015

(86) PCT No.: PCT/CN2015/076942
§ 371 (c)(1),
(2) Date: Apr. 8, 2016

(87) PCT Pub. No.: WO2015/161761
PCT Pub. Date: Oct. 29, 2015

(65) Prior Publication Data
US 2016/0255731 A1 Sep. 1, 2016

(30) Foreign Application Priority Data

Apr. 21, 2014 (CN) .......................... 2014 1 0158651
Apr. 17, 2015 (CN) ..................... 2015 2 0231095 U

(51) Int. Cl.
*E05B 15/08* (2006.01)
*H05K 5/00* (2006.01)
(Continued)

(52) U.S. Cl.
CPC ........... *H05K 5/0017* (2013.01); *A47B 81/06* (2013.01); *A47B 97/001* (2013.01); *E05B 15/08* (2013.01);
(Continued)

(58) Field of Classification Search
CPC ...... H05K 5/0017; H05K 5/0221; H05K 5/00; A47B 81/06; A47B 97/001;
(Continued)

(56) References Cited

U.S. PATENT DOCUMENTS

D532,290 S * 11/2006 David ........................... D8/373
7,641,163 B2 * 1/2010 O'Keene ................ F16M 11/10
248/284.1
(Continued)

FOREIGN PATENT DOCUMENTS

CN 101546503 A 9/2009
CN 2014 87519 * 5/2010
(Continued)

*Primary Examiner* — Nathan Cumar
(74) *Attorney, Agent, or Firm* — Craft Chu PLLC; Andrew W. Chu

(57) ABSTRACT

The mounting structure for a display screen includes a cabinet for fixing the display screen. The cabinet includes an outer frame that is connected to an external fixed structure and a panel that is detachably connected to the outer frame. The outer frame is fixedly connected to the panel through a lock mechanism in a locked state and is separated from the panel when the lock mechanism is opened. The cabinet is divided into the separate panel and the outer frame, and the outer frame that is lighter in weight is installed at first and then the panel is detachably connected to the outer frame by the lock mechanism.

4 Claims, 10 Drawing Sheets

(51) Int. Cl.
*G09F 9/33* (2006.01)
*A47B 81/06* (2006.01)
*A47B 97/00* (2006.01)
*E05B 19/00* (2006.01)
*F16M 13/02* (2006.01)
*H05K 5/02* (2006.01)
*F16M 11/22* (2006.01)
*F16B 1/00* (2006.01)

(52) U.S. Cl.
CPC ......... *E05B 19/0017* (2013.01); *F16M 11/22* (2013.01); *F16M 13/02* (2013.01); *G09F 9/33* (2013.01); *H05K 5/0221* (2013.01); *A47B 2097/005* (2013.01); *F16B 2001/0035* (2013.01); *F16B 2001/0064* (2013.01); *F16M 2200/02* (2013.01)

(58) Field of Classification Search
CPC ... A47B 2097/005; A47B 81/00; A47B 97/00; E05B 15/08; E05B 19/0017; E05B 15/00; E05B 19/00; F16M 11/22; F16M 13/02; F16M 2200/02; G09F 9/33; F16B 2001/0035; F16B 2001/0064
USPC ........................................................ 292/194
See application file for complete search history.

(56) References Cited

U.S. PATENT DOCUMENTS

2013/0256244 A1* 10/2013 Chen ..................... F16M 13/02
211/13.1
2015/0382491 A1* 12/2015 Ye ........................ F16M 11/046
248/457

FOREIGN PATENT DOCUMENTS

| CN | 201487519 U | 5/2010 |
| CN | 201810964 U | 4/2011 |
| CN | 201868037 U | 6/2011 |
| CN | 203179426 U | 9/2013 |

* cited by examiner

MOUNTING STRUCTURE FOR DISPLAY SCREEN

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present invention relates to the field of the installation of an LED display screen, and more particularly to a mounting structure for a display screen, especially suitable for installing the LED display screen to a wall or other fixed structure.

2. Description of Related Art Including Information Disclosed Under 37 CFR 1.97 and 37 CFR 1.98.

LED, an abbreviation of light emitting diode, display screen is one of the high-tech display devices with a rapid development in recent years. The LED display screen is such a display screen that displays a variety of information, such as texts, graphics, images, animations, quotes, videos and video signals, by controlling the displaying manner of the semiconductor light emitting diodes.

The LED display screen is composed of LED matrix modules, widely used in railway stations, wharves, airports, shopping malls, hospitals, hotels, banks, securities markets, construction markets, auction houses, industrial enterprises and other public places.

In current technology, when a LED display is used in the indoor or outdoor applications, as a large display device, it generally comprises an LED display screen and a cabinet for fixing the LED display screen, the cabinet being fixed on an external wall or a civil structure, etc. As shown in FIG. 17, the installation process usually adopted comprises the following five steps. In step 1, a metal structure 170, including horizontal and vertical ribs, etc., is installed on the wall or civil structure. In step 2, a tool is used to fix the cabinet 171 to the metal structure 170 including horizontal and vertical ribs through connectors, including but not limited to screws, which must be operated simultaneously from the front and the rear of the structure by several people. In step 3, data portions of the adjacent cabinets are connected manually through a network cable (including but not limited to aviation plugs, etc.), which must be operated simultaneously from the front and the rear of the structure by several people. In step 4, horizontal and vertical gaps of the cabinets are adjusted simultaneously by several people.

Installation of the LED display screen in the prior art has drawbacks in many aspects as follows.

1. The cabinet has heavier weight, general over 20 KG, and its installation is performed from the front and rear of the working plane by at least two people. Therefore, there are specific requirements for the workplace, and enough working space must be left between the display screen and the structure mounting surface, e.g. wall surface.

2. Staff must carry tools to cooperate simultaneously from the front and rear of the structure, which requires higher work intensity and longer work hours.

The accurate positioning of each cabinet and the overall installation accuracy of the display screen cannot be adjusted at the time of fixing, and the positioning and the installation accuracy of the display screen can be adjusted only after the installation is completed, and the adjustment to any of the cabinets will affect the positions of other cabinets;

3. Manually connecting the data portions of the adjacent cabinets through the network cable (including but not limited to aviation plugs, etc.) from the rear of the cabinets requires high reliability for the installation, since an operating fault of any of joints will directly result in the failure of the display screen, including but not limited to displaying the partial, displaying in error, being not bright, being bright always, displaying incorrect information etc. And, whether the connection is correct cannot be known synchronously at the time of connecting the data portions, and it can be known only when the whole screen is regulated after the connection is completed, which requires professional installation personnel (on network connections, etc.) and results in greater work intensity and less reliability of data connection.

When repairing the cabinet or the assemble of the prior art display screen, it is common to detach a cabinet or display unit to be repaired from the rear, which has many disadvantages as follows.

1. The operation must be performed from the front or the rear or both of the cabinet by several people at the same time, which requires great work intension.

2. When removing the display unit, a tool such as a screwdriver must be used to dismantle more than 10 screws; under normal circumstances, it will take more than one hour to remove one display unit.

3. It needs to remove more than four screws when removing one cabinet. Meanwhile, due to the mutual force between the upper and lower cabinets, it is difficult to dismantle only one cabinet. The common practice is to remove the adjacent several cabinets that interact mutually, which will take more than one hour under normal circumstances.

4. The operation must be done in a case of cutting off power cables and data cables. It cannot be determined whether the replacement is correct during the replacement, and the effect of maintenance can be known only at the time of electrifying and commissioning after the replacement and installation are completed.

5. Regarding the design of data and power connections and the plug number of the prior art display screen In addition, data and power connections in the prior art also have many problems. As shown in FIG. 18, more than one display units 180 forming one cabinet are connected by data cables having more than 16 pins, and each of the display unit 180 must be connected through the cable 181 having more than 16 pins to an HUB adapter plate 182 within the cabinet, which in turn is connected to a control card through a pin needle having more than 40 pins. The disadvantage resulted is that a lot of plug and data cables must be required, the operation is complex, and it is easy to cause a displaying fault.

Repairing the prior art display screen can only be done from the rear or from the rear and front, resulting in work intensity and low efficiency. And, the cabinet of the display screen must be detached and reinstalled by a tool. For a display screen such as a glass curtain wall having no reserved channel for maintenance at the back, the installation is extremely difficult and costly, and meanwhile there will be a big potential safety risk.

BRIEF SUMMARY OF THE INVENTION

In view of the above defects existing in the prior art, the present invention aims to provide a mounting structure for a display screen, with a purpose of solving the problem of the inconvenience in the installation and maintenance of the conventional display screen, improving the installation efficiency, and reducing the risk of high altitude working.

To solve the above technical problems, the present invention provides a mounting structure for a display screen, comprising a cabinet for fixing the display screen, wherein the cabinet includes an outer frame that is connected to an external fixed structure and a panel that is detachably connected to the outer frame, and the outer frame is fixedly connected to the panel through a lock mechanism in a locked state and is separated from the panel when the lock mechanism is opened.

Preferably, in the mounting structure for a display screen according to an embodiment of the present invention, lower ends of the outer frame and of the panel are rotatably connected to each other, and upper ends thereof are fixedly connected to each other through the lock mechanism. More preferably, the lower end of the outer frame is provided with a V-shaped groove, the lower end of the panel is provided with a corresponding V-shaped hook, and a plane in which the V-shaped groove lies is perpendicular to a plane in which the V-shaped hook lies such that a rotatable snap connection is formed by the V-shaped groove and the V-shaped hook; the lock mechanism includes a locking rod that is fixedly connected to the upper end of the outer frame and a locking box that is fixedly connected to the upper end of the panel; a slide channel that the locking rod can enter is opened at a side of the locking box facing the outer frame, and the locking box has an interlock means therein that comprises a latch and a locking hook for locking the latch; the latch and the locking hook are rotatably connected to the locking box and are respectively provided with a return spring; the latch includes a first tongue and a second tongue that form a U-shape opening for receiving the locking rod entering the slide channel; in the opened state, the first and the second tongues respectively coincide with the edges of the slide channel, and as the panel is rotated toward the outer frame, the locking rod enters the U-shaped opening and abuts against the first tongue so as to rotate the latch; an end of the locking hook that is rotatably connected to the locking box is a connecting portion and the other end thereof is a hook portion; the inner side of the hook portion and the outer side of the second tongue are retaining surfaces that are mutually retained; when the panel is lockedly connected to the outer frame, the hook portion is abutted against the outer side of the second tongue, thus preventing the latch containing the locking rod from rotating in the direction of releasing the locking rod; the outer side of the first tongue, the inner side of the second tongue and the outer side of the hook portion are smoothly curved so as to prevent the hook portion from interference with the first and the second tongues during the locking.

Further, the mounting structure of a display screen further comprises a key for unlocking that includes a key rod, a tapered head at the leading end of the key rod and a boss adjacent the head that protrudes from the key rod such that a step is formed between the boss and the key rod, and an operating handle is at the trailing end of the key rod; a lockhole is provided on the lock shell such that the key after the insertion can contact the connecting portion of the locking hook; a projecting ratchet having a radial retaining surface is provided on the connecting portion of the locking hook; after the key is inserted into the lockhole, the boss is caught on the retaining surface of the ratchet, and pulling the key can rotate the locking hook so as to achieve the unlocking.

Furthermore, the mounting structure of a display screen further comprises an anti-drop structure for preventing the key from automatically dropping that includes a chuck particular to the key; a surface at the inner end of the chuck facing the direction of the keyhole is a slope surface, and the opposite surface is a flat surface; the chuck is wound with a chuck spring for returning which makes the chuck extend so that the flat surface at the inner end of the chuck abuts against the boss of the key, thus preventing the key from exiting outwards, and the outer end of the chuck projects out of the locking box and is provided with a chuck handle.

Preferably, the mounting structure of a display screen further comprises an elastic pad that acts on the outer side of the first tongue in the locked state.

In the mounting structure for a display screen according to anther embodiment of the present invention, the lower end of the outer frame is provided with a V-shaped groove, and the lower end of the panel is provided with a corresponding V-shaped hook; the V-shaped groove and the V-shaped hook are parallel to each other and are respectively provided on opposite sides thereof with a positioning hole and a positioning pin; the lock mechanism includes a locking rod that is fixedly connected to the upper end of the outer frame and an interlock means that is fixedly connected to the upper end of the panel; the interlock means includes a latch and a slider block for locking the latch; the latch and the slider block are rotatably provided on the panel and are respectively provided with a return spring; the latch includes a first tongue and a second tongue that form a U-shape opening for receiving the locking rod entering a slide channel; in the unlocked state, the first and the second tongues respectively coincide with the edges of the slide channel, and as the panel is rotated toward the outer frame, the locking rod moves into the U-shaped opening and abuts against the first tongue so as to rotate the latch;

the middle of the slider block is rotatably connected to the panel, and one of its ends is a hook portion; the inner side of the hook portion and the outer side of the second tongue are retaining surfaces that are mutually retained; when the panel is lockedly connected to the outer frame, the hook portion is abutted against the outer side of the second tongue, thus preventing the latch containing the locking rod from rotating in the direction of releasing the locking rod; the other end of the slider block or the slider block as a whole is made of magnetic material; the outer side of the first tongue, the inner side of the second tongue and the outer side of the hook portion are smoothly curved so as to prevent the hook portion from interference with the first and the second tongues during the locking.

Preferable, the mounting structure for a display screen further comprises a magnet that attracts the slider block to rotate in the case of unlocking so as to release the latch.

In the mounting structure for a display screen according to yet another embodiment of the present invention, the panel when detached or installed is moved into and out of the outer frame in parallel thereto, and the side of the outer frame and the opposite side of the panel are fixedly connected to each other through the lock mechanism.

Preferably, in the mounting structure of a display screen, the lock mechanism comprises a lockhole that is respectively provided in the upper end and the lower end of the outer frame in the vertical direction and a tongue that is provided at the inner side of the panel and is movable in the up and down direction, and the tongue has a return spring thereon; during installation, the panel is translated toward the outer frame so as to translate the tongue toward the outer frame, and the tongue under the press of the outer frame compresses the return spring; when the tongue is aligned with the lockhole, the tongue under action of the return spring extends into the lockhole so that the locking is achieved; an end of the tongue closer to the outer frame is curved.

Preferably, the lock mechanism comprises a lockhole that is respectively provided in the upper end and the lower end of the outer frame in the vertical direction and a tongue that is provided at the inner side of the panel and is movable in the up and down direction, and the tongue has a return spring thereon, the other end of the return spring being provided with a first slider block; the lock mechanism further includes a hinge of parallelogram having a pivot point at each of its four vertexes; each of the first slider blocks is respectively at the upper vertex and the lower vertex of the parallelogram, the left vertex of the parallelogram is fixed on a base surface of the outer frame, and the right vertex thereof is provided on a horizontal slider block that is horizontally movable and that is provided on the back of the panel via a resilient member; during installation, when the panel is translated toward the outer frame, the tongue under the press of the outer frame pushes the upper and lower vertexes of the parallelogram so as to shorten the distance therebetween and pulls the left and right vertexes of the parallelogram so as to lengthen the distance therebetween, and the horizontal slider block compresses the resilient member; when the tongues are aligned with the lockholes respectively, the resilient member pushes the horizontal slider block to move so as to shorten the distance between the left and right vertices of the parallelogram and lengthen the distance between the upper and lower vertexes thereof, and the tongues under the action of the return spring extend into the lockholes respectively so that the locking is achieved, and an end of the tongue closer to the outer frame is curved.

More preferably, in the mounting structure of a display screen, the base surface of the outer frame is provided with an unlocking spring that is in a compressed state when the panel is lockedly connected to the outer frame.

Preferably, the outer frame is a steel structure, and the four corners of the panel are embedded with an electromagnet respectively.

Any of mounting structures for a display screen described above further comprises a plug and a socket respectively provided on the outer frame and the panel.

In any of mounting structures for a display screen described above, the outer frames are positioned relative to each other by a positioning member that is provided at the side of the outer frame.

In any of mounting structures for a display screen described above, a positioning column is provided on the outer frame, a corresponding positioning hole is provided in the panel, and the adjacent outer frames during installation are positioned by a mounting fixture having a positioning hole.

The mounting structure for a display screen of the present invention has many advantages as below. The cabinet is divided into the separate panel and the outer frame, and the outer frame that is lighter in weight is installed at first and then the panel is detachably connected to the outer frame by the lock mechanism. The installation or maintenance can be performed from the front by hand without using a tool, which is safe, convenient and simple.

BRIEF DESCRIPTION OF THE SEVERAL VIEWS OF THE DRAWINGS

FIG. 11 is a serial of side views illustrating the opening of the mounting structure for a display screen according to a second embodiment of the present invention, wherein FIG. 11*a* shows a locked state, FIG. 11*b* shows the process of opening, and FIG. 11*c* shows an opened state.

DETAILED DESCRIPTION OF THE INVENTION

In order to make the object, technical solutions and advantages of this invention become clear, the present invention will be described in further detail with reference to the accompanying drawings and examples. It should be understood that the specific examples described herein are merely for the purpose of illustration, rather than limiting the present invention.

First Embodiment

Figure 1:
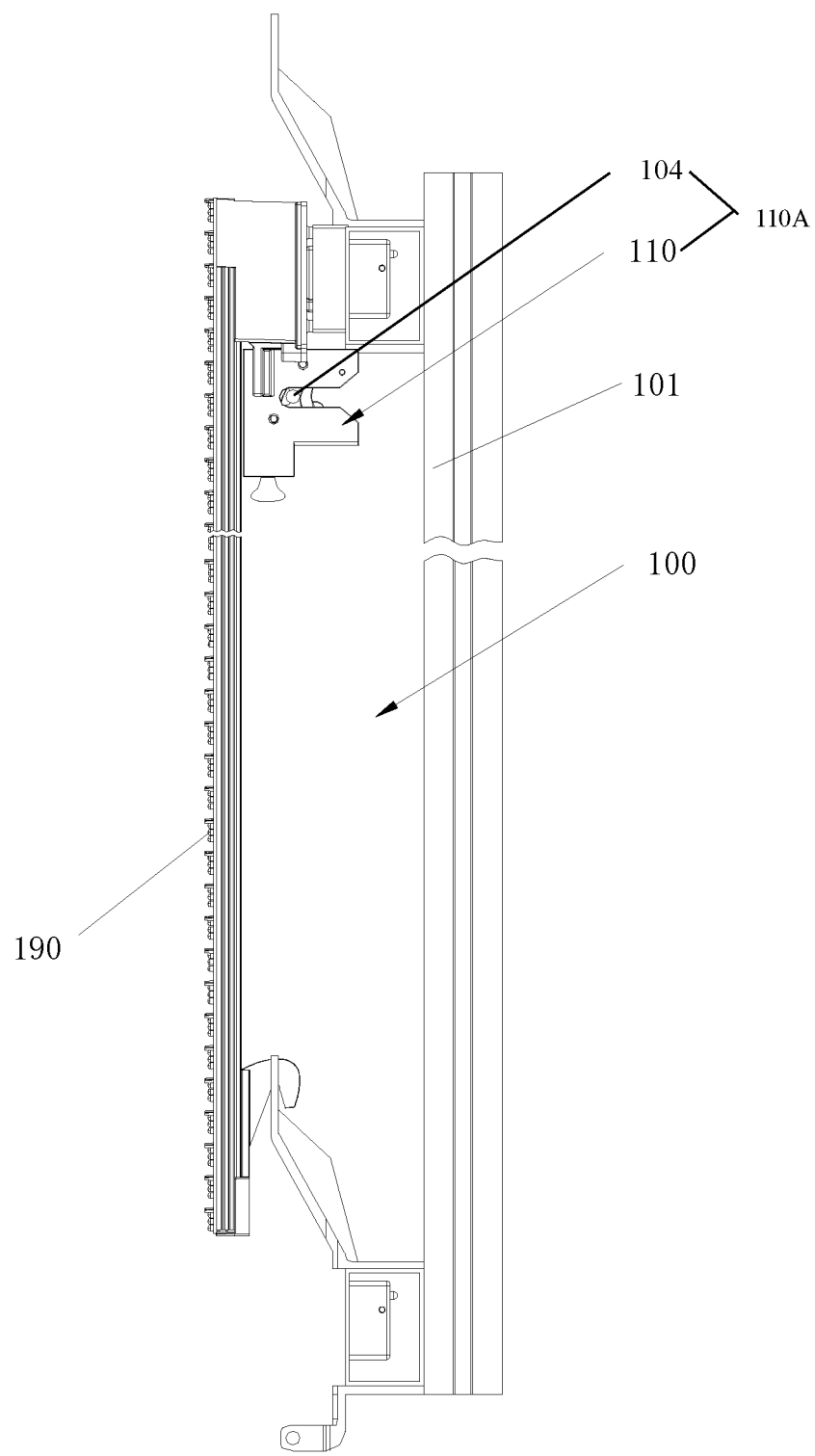
FIG. 1 is a side elevation view of a mounting structure for a display screen according to a first embodiment of the present invention.
Figure 2:
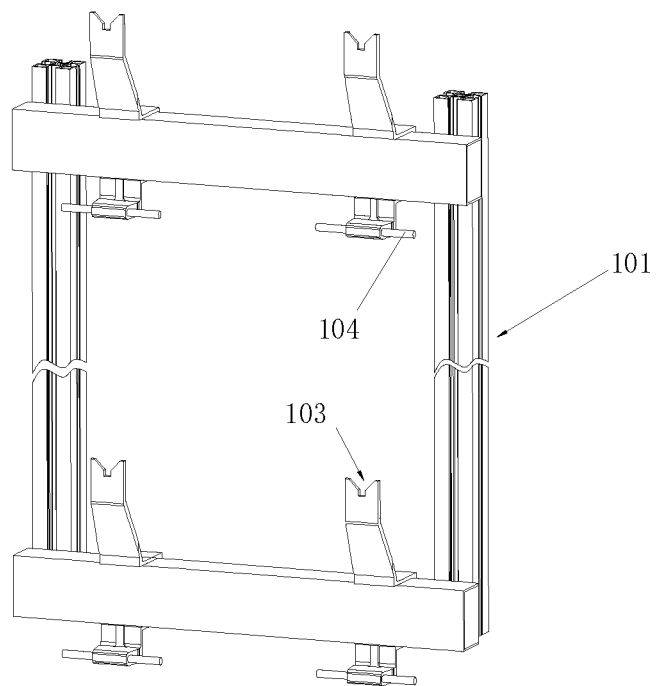
FIG. 2 is a perspective structural view of an outer frame of a cabinet of the mounting structure for a display screen shown in FIG. 1.
Figure 3:
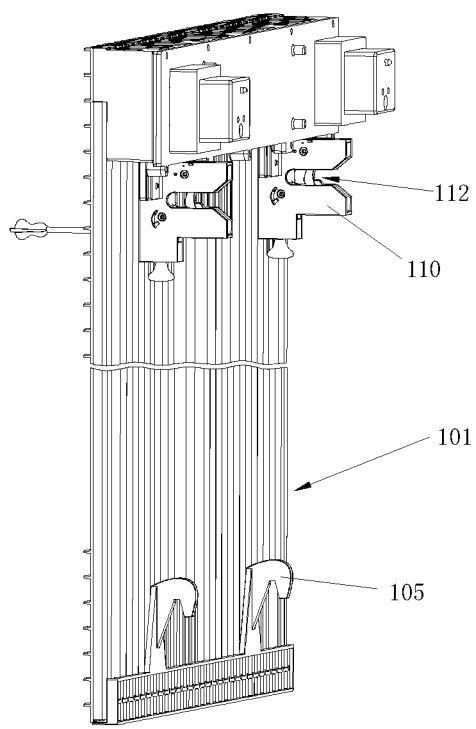
FIG. 3 is a perspective structural view of a panel of the mounting structure for a display screen shown in FIG. 1.
Figure 4:
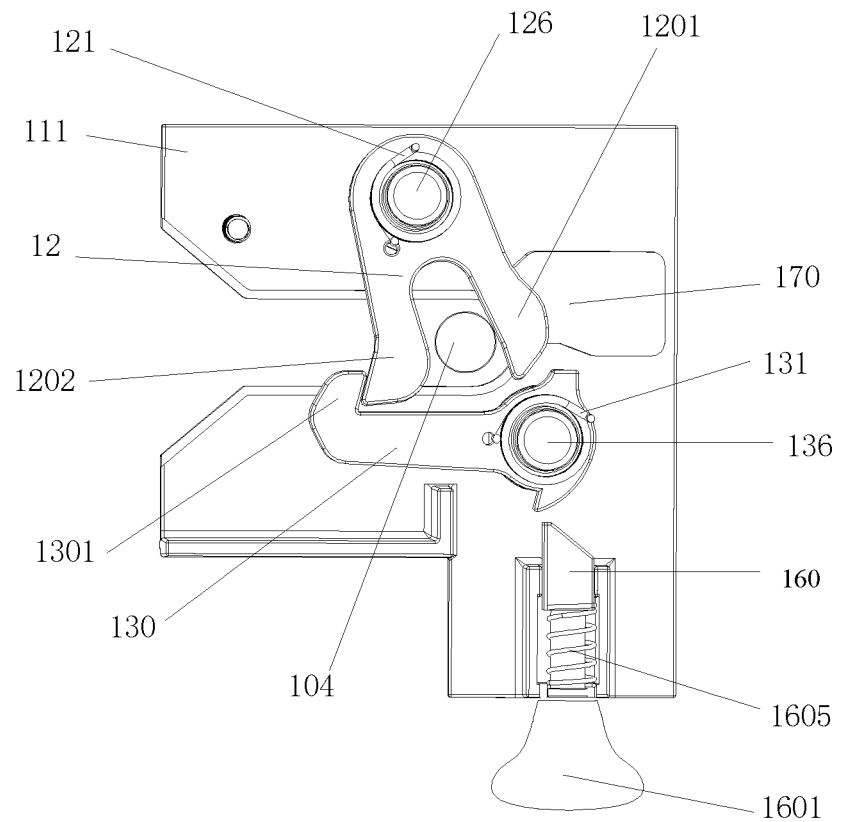
FIG. 4 is a schematic view of a lock mechanism of the mounting structure for a display screen shown in FIG. 1 in a locked state.
Figure 5:
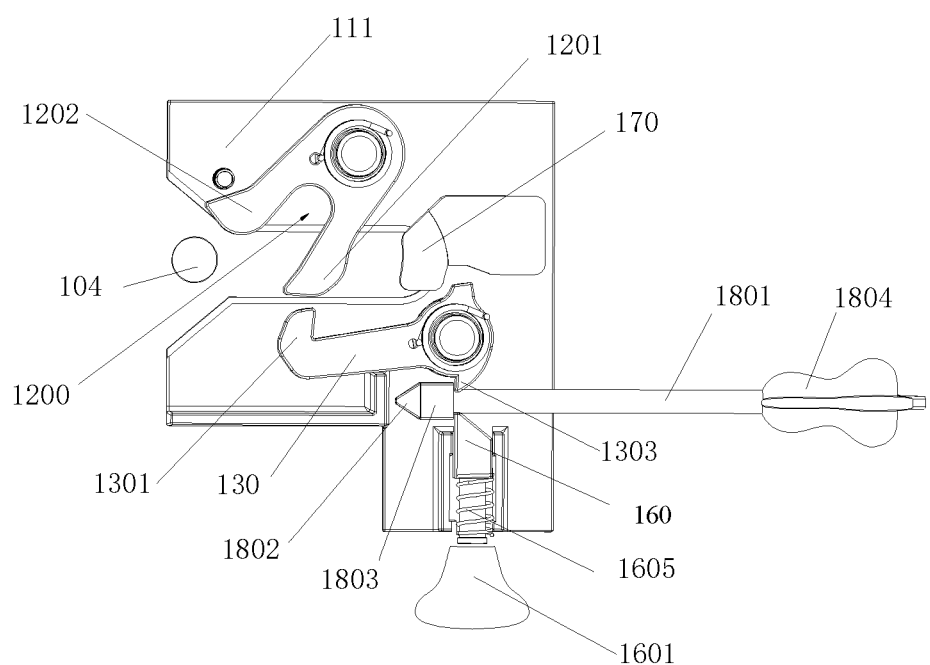
FIG. 5 is a schematic view of the lock mechanism shown in FIG. 4 in an opened state.
Figure 6:
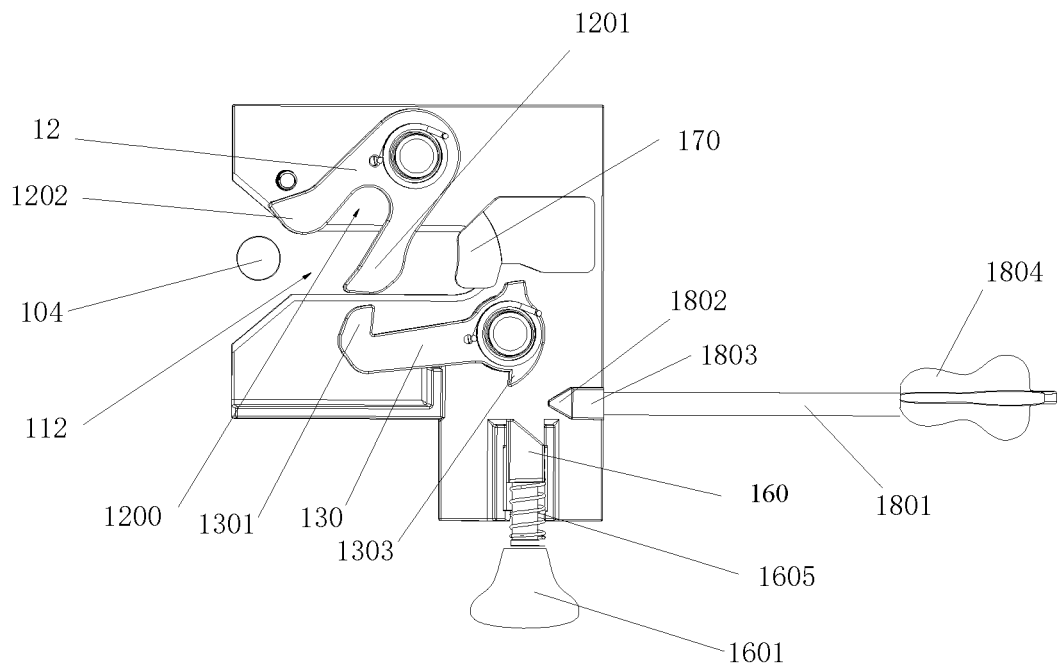
FIG. 6 is a schematic view of the key of the lock mechanism shown in FIG. 5 when pulled out.
Figure 7:
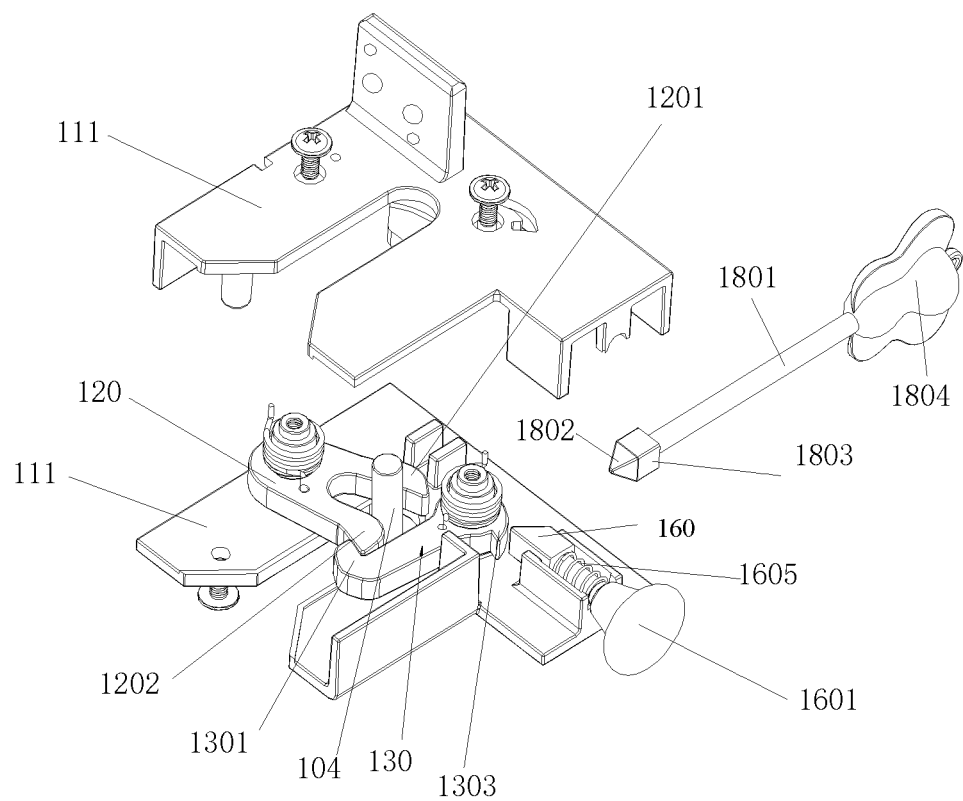
FIG. 7 is an exploded perspective schematic view of the lock mechanism shown in FIG. 4.

FIG. 1 is a side view of a mounting structure for a display screen according to a first embodiment of the present invention. FIG. 2 is a perspective schematic structural view of an outer frame of a cabinet of the mounting structure for a display screen shown in FIG. 1. FIG. 3 is a perspective schematic structural view of a panel of the mounting structure for a display screen shown in FIG. 1. FIG. 4 is a schematic view of a lock mechanism of the mounting structure for a display screen shown in FIG. 1 in a locked state. FIG. 5 is a schematic view of the lock mechanism shown in FIG. 4 in an opened state. FIG. 6 is a schematic view of the key of the lock mechanism shown in FIG. 5 when pulled out. FIG. 7 is an exploded perspective schematic view of the lock mechanism shown in FIG. 4.

The mounting structure for a display screen of the present invention is used to mount a display screen, especially an LED display screen, to a fixed structure including but not limited to a wall, a civil structure and a metal structure. As shown in FIGS. 1-8, the mounting structure for a display screen according to the first embodiment of the present invention comprises, at one side, a cabinet 100 for fixing a display screen 190, wherein the cabinet 100 includes an outer frame 101 that is connected to the fixed structure (not shown) and a panel 102 that is detachably connected to the outer frame 101, and the display screen 190 is provided outside of the panel 102. The connection between the display screen 190 and the panel 102 is the same as that in the prior art and thus is omitted. In use of the cabinet 100, the lower end of the outer frame 101 and the lower end of the panel 102 form a snap structure, and the upper ends thereof are fixed together through a lock mechanism 110A. During the maintenance and detachment, the panel 102 can be quickly removed from the outer frame 101 by opening the lock mechanism. In the first embodiment, one panel corresponds to one outer frame. It may also be conceived that one panel corresponds to a plurality of outer frames, that is, one panel is mounted after the plurality of outer frames are combined.

The first embodiment of the present invention will be understood with reference to FIGS. 1-7. As shown in FIGS. 1-2, in the first embodiment, the lower end of the outer frame 101 is provided with a V-shaped groove 103 having an opening facing upwards, and the opposite upper end is provided with a transverse locking rod 104. Correspondingly, as shown in FIGS. 1 and 3, the lower end, here referring to the position in FIG. 3, of the panel 102 at a side connecting with the outer frame 101 is provided with a V-shaped hook 105 having an opening facing downwards. In the mounted state, a plane in which the V-shaped hook 105 lies is perpendicular to a plane in which the V-shaped groove 103 is lies, and the V-shaped hook 105 and the V-shaped groove 103 are snapped perpendicular to each other, facilitating the positioning therebetween. Obviously, the bottoms of the V-shaped hook 105 and of the V-shaped groove 103 should be set as a small U-shape respectively in order to facilitate the snapping therebetween. This embodiment adopts such a structure that the V-shaped hook 105 and the V-shaped groove 103 are snapped together, because after the V-shaped hook 105 is placed on the V-shaped groove 103, the panel 102 can be rotatable around the V-shaped groove 103 in a direction toward or away from the outer frame 101 so that a rotatable snap connection is formed, facilitating the installation and removal.

Continuing to refer to FIGS. 1 and 3, as shown in FIG. 3, the upper end, herein referring to the position in FIG. 3, of the panel 102 at the side connecting with the outer frame 101 is provided with a locking box 110. The locking box 110 functions to lock the panel 102 and the outer frame 101 together by locking the locking rod 104 so as to form a complete cabinet when the panel 102 is connected to the outer frame 101, and functions to, upon maintenance, facilitate the unlocking and detaching the panel 102 from the outer frame 101 easily. There are many specific configurations of the locking box 110, as long as it is capable of locking so as to fixedly connect the panel 102 to the outer frame 101 in use, and is capable of unlocking so as to easily detach the panel 102 from the outer frame 101 in case of removal or maintenance.

More specifically, in the first embodiment, the locking box 110 shown in FIGS. 4 to 7 is used. The locking box 110 comprises a lock shell 111 and an interlock means that is located inside the lock shell 111, wherein a slide channel 112 is opened at the lock shell 111 which in the present embodiment is formed by two locking panels 2 fixedly connected to each other, and the locking rod 104 can enter or exit from the slide channel. The interlock means comprises a latch 120 and a locking hook 130 for locking the latch 120. An end of the latch 120 is rotatably connected to the first rotation shaft 126 fixed to the lock shell, and is provided with a first return spring 121. The other end of the latch 120 includes a first tongue 1201 and an opposite second tongue 1202 so as to form a U-shaped opening 1200 for retaining the locking rod 104 entering the slide channel 112. In the opened state, the first return spring 121 makes the U-shaped opening 1200 intersect with the slide channel 112, forming a state in which the lower ends of the first and second tongues 1201 and 1202 forming the U-shaped opening 1200 respectively coincide with the two edges of the slide channel 112 so as to receive the locking rod 104 entering the slide channel 112. One tongue in FIG. 4 in the locked state retaining the locking hook 130 is designated as the second tongue 1202, and the other is called as the first tongue 1201. The outer side of the first tongue 1201 with respect to the U-shaped opening 1200 is a rounded shape, and the outer side of the second tongue 1202 is a flat shape.

One end of the locking hook 130 is a connecting portion that is rotatably connected to the second rotation shaft 136 fixed on the lock shell 111 and that is provided with a second return spring 131. In the locked state, a hook portion 1301 provided at the other end of the locking hook 130 contacts the outer side of the second tongue 1202 to form a shape that prevents the latch 120, which under the action of the first return spring 121 has a tendency to rotate clockwise, from rotating clockwise, and the hook portion 1301 interacts with the outer side of the second tongue 1202 so as to form the interlock means between the latch 120 and the locking hook 130. In the locked state, the locking hook 130 has a tendency to rotate clockwise under the action of the second return spring 131, and the second tongue 1202 have a tendency to rotate clockwise under the action of the first return spring, so that the outer side of the second tongue 1202 interacts with the hook portion 1301 so as to make both of them in an equilibrium state. In order to unlock the locking box 110 in FIG. 4, it is needed to rotate the locking hook 130 counterclockwise to reach a position shown in FIG. 5. As shown in FIG. 5, in case of opening, the locking hook 130 is rotated counterclockwise under the action of external force so that the hook portion 1301 is disengaged from the second tongue 1202, the latch 120 under the action of the first return spring is rotated clockwise back to the position at which the first tongue 1201 and the second tongue 1202 coincide with the two edges of the slide channel 112 respectively, and the lock shell 111 is translated so as to make the locking rod 104 out of the slide channel 112, whereby achieving the unlocking. At this time, the locking hook 130 under the action of the second return spring 131 returns back to its equilibrium position which may be at or below the slide channel 112, as long as the length of the second tongue 1202 can be retained mutually by the hook portion 1301 of the locking hook 130. In order to prevent the first tongue 1201 and the second tongue 1201 from interfering with the hook portion 1301 of the locking hook 130, as shown in FIGS. 3-5, the outer side of the first tongue 1201, the inner side of the second tongue 1202, and the outer side of the hook portion 1301 are all in a smoothly arc shape, such that when the outer side of the hook portion 1301 contacts the outer side of first tongue 1201 or the inner side of the second tongue 1202, they can slide relative to each other rather than being stuck.

The working status when the locking box 110 of the present embodiment is locked will be understood with reference to FIGS. 3 and 4. As shown in FIG. 4, in the locked state, the locking rod 104 is retained by the latch 120 which in turn is locked by the locking hook 130, reaching an equilibrium state, so that the upper end of the panel 102 having installed the locking box 110 thereon is firmly connected to the upper end of the outer frame 101 provided with the locking rod 104, and since the lower ends of the panel 102 and of the outer frame 101 have formed a fixed connection through the mutually snapped V-shaped groove structures, the panel 102 and the outer frame 101 are fixedly connected to each other.

The working process of installing the panel 102 on the outer frame 101 or removing it from the outer frame 101 is described with reference to FIGS. 1-5 again. Upon installation, at first, the V-shaped hook 105 at the lower end of the panel 102 is placed on the V-shaped groove 103 at the lower end of the outer frame 101 to make them mutually snapped, and then the panel 102 is capable of rotating relative to the outer frame 101. The panel 102 is rotated toward the outer frame 101, and the locking rod 104 at the upper end of the outer frame 101 enters the slide channel 112 of the locking box 110 at the upper end of the panel 102. By continuing to push the panel 102, the locking rod 104 contacts the first tongue to rotate the first tongue and second tongue counterclockwise. Since the outer side of hook portion 1301, the outer side of the first tongue 1201 and the inner side of the second tongue 1202 are smoothly arc-shaped, they slide relative to each other in case of contact, until the inner side of the hook portion 1301 of the locking hook 130 is mutually retained by the outer side of the second tongue 1202, under the action of the respective return spring, so as to form a locked structure.

During the detachment, the locking hook 130 is rotated counterclockwise by an external force so as to disengage the hook portion 1301 from the second tongue 1202, and then the panel 102 is rotated away from the outer frame 101, and then the locking rod 104 contacts the second tongue to push the latch 120 to rotate clockwise. The latch 120 reaches a position shown in FIG. 5, due to lack of the blocking from the hook portion 1301. The panel 102 is continued to rotate, and the locking rod 104 will exit from the lock shell 111, thus achieving the unlocking of the panel 102 from the outer frame 101. At this time, by moving the panel 102 obliquely upward, the panel 102 can be separated from the outer frame 101.

As shown in FIGS. 4 and 5, in this embodiment, as a preferred selection, in order to increase the locking force, an elastic pad 170 is further provided. The elastic pad 170 abuts against the outer side of the first tongue 1201 of the latch 120 in the locked state, giving an elastic force to rotate the latch 120 clockwise so as to make the latch 120 in a more stable state.

Further, as shown in FIGS. 5 and 6, in the present embodiment, a key 180 is used to rotate the locking hook 130 counterclockwise. The key 180 includes a key rod 1801, a taper head 1802 which is located at the leading end of the key rod 1801, and a boss 1803 adjacent the head 1802 that protrudes from the key rod 1801 such that a step is formed between the boss 1803 and the key rod 1801, and an operating handle 1804 is at the trailing end of the key rod 1801. A lockhole is provided on the lock shell 111 such that the key 180 after insertion can contact the connecting portion of the locking hook 130. A projecting ratchet 1303 having a radial retaining surface 1302 is provided on the connecting portion of the locking hook 130. The outer side of the ratchet 1303 has a smooth arc surface 1303 that is connected at the top with the radial retaining surface 1302. After the key 180 is inserted, the boss 1803 contacts the retaining surface 1302 of the ratchet 1303, and the key 180 is pulled so as to rotate the locking hook 130 counterclockwise, thus achieving the purpose of unlocking. It should be noted that the structure of this embodiment does not necessarily use the key to achieve the unlocking. For example, although not shown, the hook portion 1301 of the locking hook 130 may be provided with a rope leading to the outside of the cabinet, which can be pulled to rotate the locking hook 130 counterclockwise so as to achieve the unlocking. Or, it is possible to provide a projection in a direction opposite to the ratchet 1303 shown in FIG. 4 and push the projection to rotate the locking hook 130 counterclockwise. It is not limited to the manner shown in the drawings. It may be even conceived that the locking hook 130 is made of magnetic material including e.g., iron, steel, nickel, and a magnet is placed outside of the lock shell 111 to rotate the locking hook 130 counterclockwise so as to achieve the unlocking.

To further prevent the key 180 from dropping in the unlocked state, as shown in FIGS. 4-6, an anti-drop structure for preventing the key 180 from dropping is further provided, which includes a chuck 160 particular to the key 180. The outer end of the chuck 160 is exposed outside of the locking box 110 and is provided with a chuck handle 1601. A surface at the inner end of the chuck 160 facing the direction of the keyhole is a slope surface, and the opposite surface is a flat surface. The chuck 160 is wound with a chuck spring 1605 for returning. The chuck spring 1605 extends the chuck 160 so that the flat surface of the chuck 160 abuts against the boss 1803 of the key 180, thus preventing the key 180 from exiting outwards. As shown in FIG. 6, when it is need to withdraw the key, the chuck handle 1601 is pulled so as to make the chuck out of being retained and thus to withdraw the key. The reason why the surface at the inner end of the chuck 160 facing the direction of the keyhole is the slope surface is that, when the key 180 enters the interlock means shown in FIG. 4 in the locked state, the chuck 160 will not impede the key 180, and the chuck 160 under the action of the tapered head 1802 of the key 180 is moved downward to compress the chuck spring 1605 so that the key 180 can successfully enter. When the boss 1803 of the key 180 and the ratchet are mutually retained, under the action of the chuck spring 1605, the chuck 160 is also restored and retained by the boss 1803 of the key 180, preventing the key 180 from dropping automatically.

As indicated above, in the first embodiment, the outer frame 101 and the panel 102 of the cabinet 100 have a detachable connection, and both of them in the connected state can achieve the locking. Since the accurate positioning between the outer frame 101 and the panel 102 can be achieved through mutually retaining structures of the V-shaped groove and the V-shaped hook on the lower portion thereof, the mounting accuracy of the entire cabinet and also of the display screen can be ensured, as long as the mounting accuracy between the outer frames 101 is ensured. Therefore, in order to achieve precise positioning and installation, the outer frame 101 in the present invention is precisely positioned so as to achieve precise installation.

Figure 8:
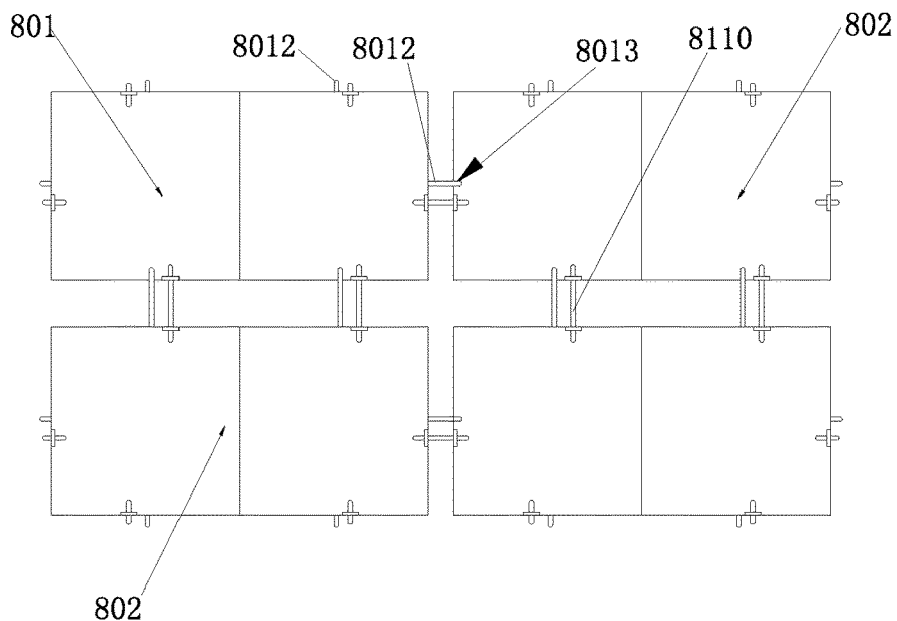
FIG. 8 is a schematic view illustrating the first mounting manner of the outer frame of the cabinet of the mounting structure for a display screen according to the first embodiment of the present invention.

FIG. 8 is a schematic view illustrating the first mounting manner of the outer frame of the cabinet of the mounting structure for a display screen according to the first embodiment of the present invention. As shown in FIG. 8, the sides of adjacent two outer frames that are connected to each other are respectively provided with a first positioning pin 8012 and a corresponding first positioning hole 8013 for accurate positioning, and a corresponding connection bolt 8110 is used for connecting the adjacent outer frames. During installation, the major focus is to accurately position and install the first outer frame 801, and the other outer frames 802 can be positioned relative to the first outer frame through the first positioning pin and its corresponding first positioning hole, whereby achieving the accurate positioning of all the outer frames. Based on this, the panel is then mounted and thus also has an accurate positioning and convenient installation, and there is no need to adjust the positioning after the installation. The numbers of the first positioning pin and the first positioning hole are not limited, and in the case of having a plurality of the first positioning pins and the first positioning holes, they are preferably in the form of asymmetric distribution. The first positioning pin and the first positioning hole may also be replaced by a combination of a positioning rib and a positioning groove. Compared with a manner of installing the cabinet as a whole, it has lightweight and is easier to install, because it is only need to install the outer frames while the positioning is carried out.

Figure 9:
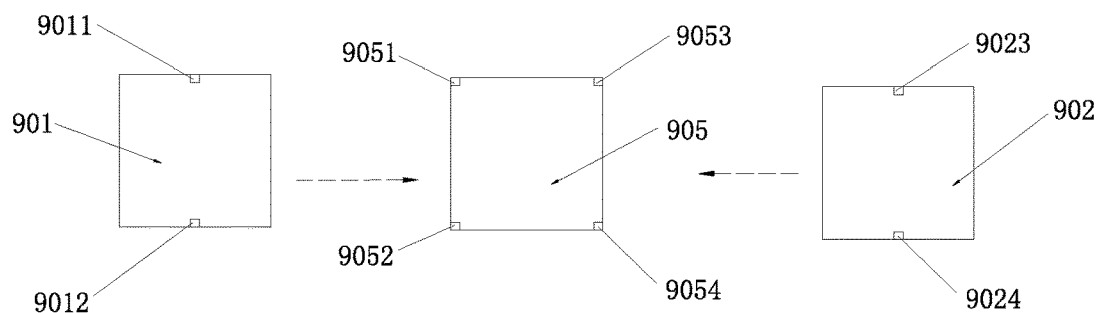
FIG. 9 is a schematic view illustrating the second mounting manner of the outer frame of the cabinet of the mounting structure for a display screen according to the first embodiment of the present invention.

FIG. 9 is a schematic view illustrating the second mounting manner of the outer frame of the cabinet of the mounting structure for a display screen according to the first embodiment of the present invention. As shown in FIG. 9, the first outer frame 901 is provided with a first positioning column 9011 and a second positioning column 9012, and the second outer frame 902 is provided with a third positioning column 9023 and a fourth positioning column 9024. A mounting fixture 905 is made according to a design distance between the positioning columns on the first outer frame 901 and the adjacent second outer frame 902. Four corners of the mounting fixture 905 are provided with a first positioning hole 9051, a second positioning hole 9052, a third positioning hole 9053 and a fourth positioning hole 9054, respectively. A distance between the first positioning hole 9051 and the second positioning hole 9052 is equal to a distance between the first positioning column 9011 and the second positioning column 9012, and a distance between the third positioning hole 9053 and the fourth positioning hole 9054 is equal to a distance between the third positioning column 9023 and the fourth positioning column 9024. A distance between the first positioning hole 9051 and the third positioning hole 9053 is determined by a distance between the first positioning column 9011 and the third positioning column 9023 respectively provided on the first outer frame 901 and the second outer frame 902 after being installed according to the design requirement. Similarly, a distance between the second positioning hole 9052 and the fourth positioning hole 9054 is also determined by a design distance between the second positioning column 9012 and the fourth positioning column 9024. In other words, in FIG. 9, the distance between the positioning holes of the mounting fixture 905 in the up and down direction is determined by the distance between the positioning columns on the outer frame, while the distance between the positioning holes in the horizontal direction is equal to the distance between the positioning columns on the adjacent outer frames that meet the design requirements. Thus, it is only necessary to install the first outer frame 901 precisely, and an outer frame adjacent to the first outer frame 901 can be accurately positioned by using the mounting fixture 905, and so on. Therefore, a rectangular structure consisting of the outer frames has a shape and position with high accuracy. Based on this, the panel is then mounted and thus also has an accurate positioning and convenient installation, and there is no need to adjust the positioning after the installation.

Due to the lighter cabinet outer frame, it is easy to install the first outer frame, and easy to control the mounting accuracy. Such a manner of installation puts a low installation requirement for installation personnel, since the accuracy of the overall installation can be ensured only by connecting the outer frames together. It has a low installation intensity and can be done by multiple person at the same time. The accuracy of the overall installation can be ensured upon installation, and a subsequent adjustment is not required. Installation time is very short.

Figure 10:
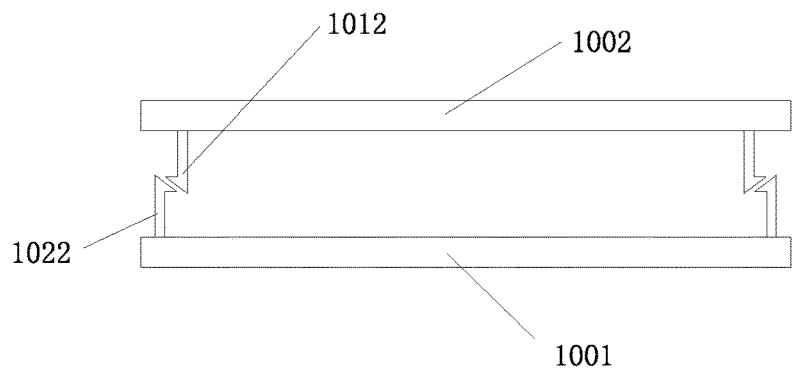
FIG. 10 is a schematic structural view of a bayonet of a mask and the panel of the mounting structure for a display screen according to the first embodiment.

FIG. 10 is a schematic structural view of a bayonet of a mask and the panel of the mounting structure for a display screen according to the first embodiment. A mask 1002 is connected to the display unit 1001 by a bayonet. The mask 1002 and the display unit 1001 are respectively provided with a first bayonet 1012 and a second bayonet 1022, both of which are elastic and have slope surfaces that are against each other during the installation and flat surfaces that are mutually retained each other in the snapped state. The mask 1002 is connected to the display unit 100 by a bayonet structure that may be unlocked by contacting slightly during maintenance so as to detach the panel and thus to repair and change a damaged part, which process can be done quickly with no tool and without any damage.

This embodiment has many advantages as follows.

1. A matrix is formed by the connection of the outer frames, and each panel corresponds to one or more outer frames. There is no force between the panels mounted on the outer frame, the advantage of which is that the panel can be removed from the front, and it is possible to only remove a damaged panel in any position. During installation, since the outer frames have the same structure and can be positioned relative to each other, the panel installed after the outer frame can automatically meet the requirements of the cabinet gap and flatness, thus saving installation time.

2. When the lower ends of the outer frame and of the panel are connected by both the V-shaped structures, the panel is rotatable about a point where the two V shapes intersect as a rotation axis, so that the panel may be removed either from the front or from the back, facilitating the installation, removal and maintenance.

3. Since the upper ends of the outer frame and of the panel are fixedly connected by the lock mechanism, the installation and disassembly of the cabinet can be done from the front by hand without a tool. During maintenance, the lock mechanism can be unlocked rapidly by two ways of a non-contact manner (by means of magnet attracting) and a contact manner (by means of the key) so as to separate the panel from the outer frame of the cabinet, and at the same time the power supply is automatically decoupled with the data.

4. There is a space for heat dissipation formed between the outer frame and the panel in the present embodiment. The outer frame is preferably made of aluminum alloy with good heat dissipation performance, and the panel will be provided on the outer frame so as to form the overall heat dissipating system, increasing the heat dissipating area, improving the reliability and reducing the failure rate.

Second Embodiment

Figure 11:
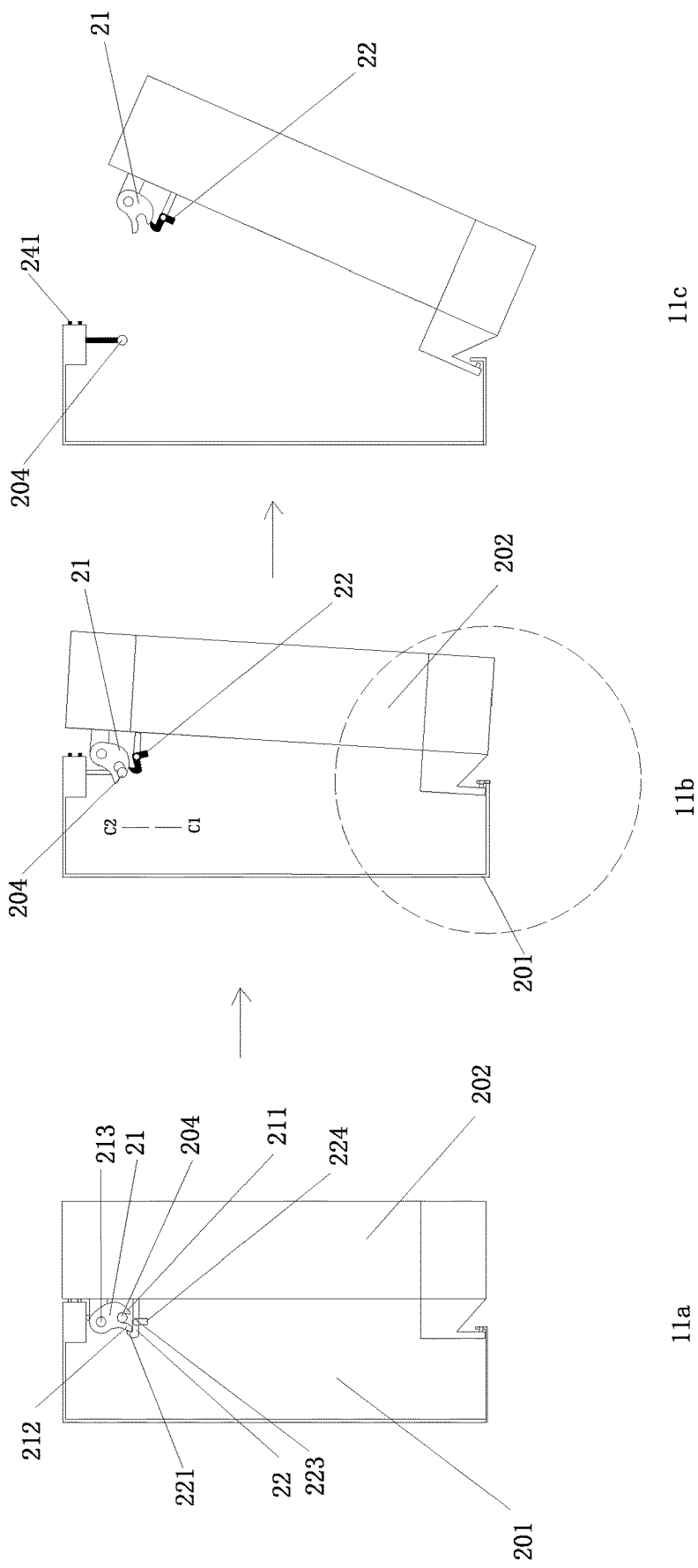
Figure 12:
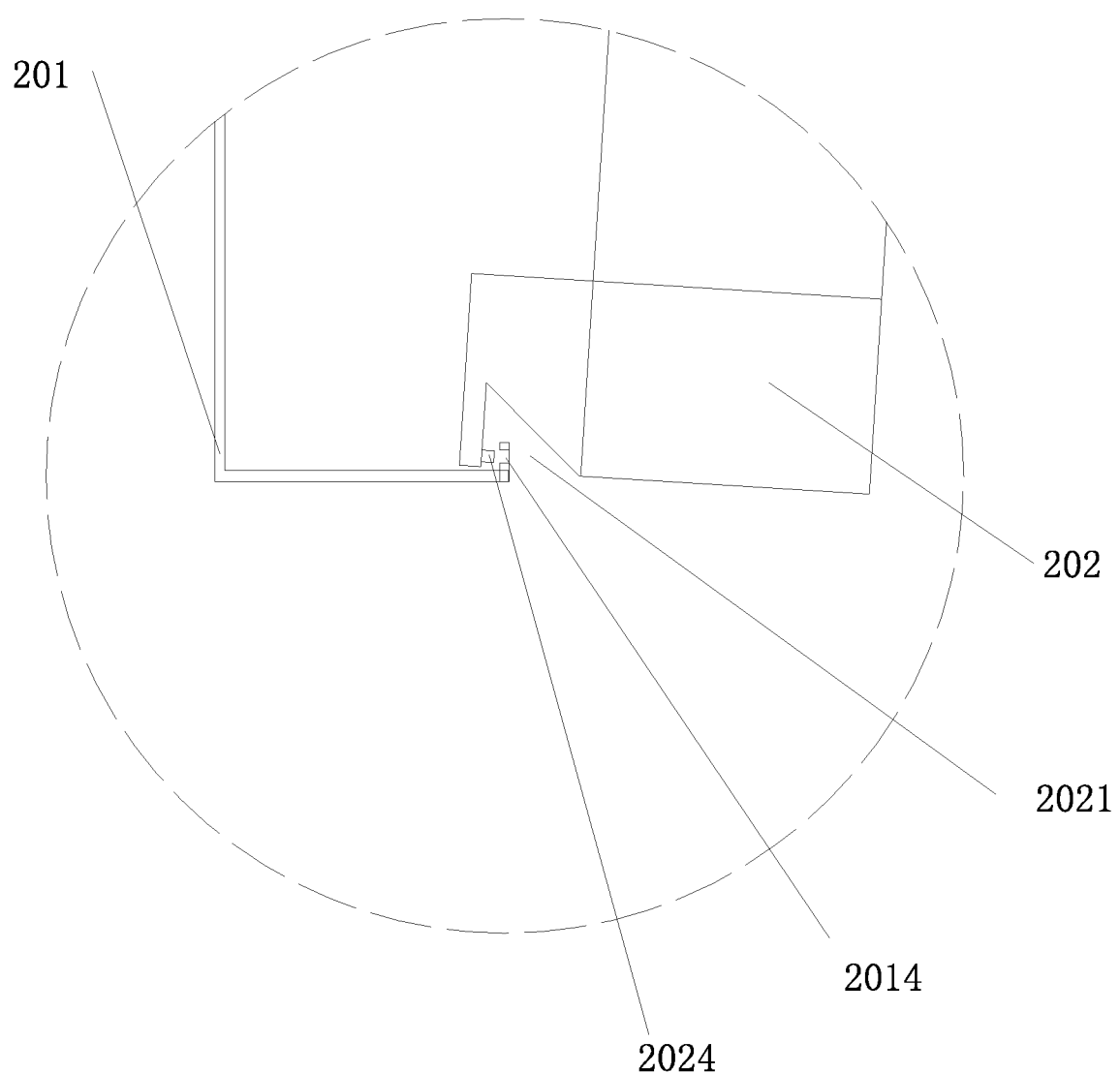
FIG. 12 is an enlarge view of the lower end of FIG. 11*b*.

FIG. 11 is a serial of side views illustrating the opening of the mounting structure for a display screen according to a second embodiment of the present invention, wherein FIG. 11a shows a locked state, FIG. 11b shows the process of opening, and FIG. 11c shows an opened state. FIG. 12 is an enlarge view of the lower end of FIG. 11b.

The panel 202 and the outer frame 201 in the second embodiment have similar structures to those in the first embodiment respectively. The differences therebetween are that, as shown in FIGS. 11 and 12, the inner side of the lower end surface of the outer frame 201 has an upwardly bent side edge having a horizontal positioning hole 2014 therein, so that a V-shaped groove is formed between it and the lower end surface. Correspondingly, the lower end of the panel 202 is provided with a V-shaped hook 2021. The V-shaped hook 2021 in the second embodiment differs from the V-shaped hook of the first embodiment in that, the side of the V-shaped hook 2021 snapped with the outer frame 201 is located in the vertical direction in the locked state, that is in close contact with the side edge of the panel 202, and is provide with a positioning column 2024 corresponding to the positioning hole 2014. The panel 202 and the outer frame 201 are positioned through the cooperation of the positioning column 2024 and the positioning hole 2014, and are snapped together when the panel 202 is inclined to the outer frame 201, at this time a portion of the lower end of the panel 202 being in contact with the outer frame 201 too. The above structure is relatively simple and can achieve a quick connection and removal. In this embodiment, the edge of the V-shaped hook snapped with the V-shaped groove can be set as a straight edge (i.e. in the locked state in the vertical direction), or can be set as a sloping edge, but the straight edge facilitates the easier positioning therebetween. The upper ends of the panel 202 and of the outer frame 201 may still be fixedly connection by the lock mechanism, such as the lock mechanism 110A in the first embodiment. As shown in FIG. 11, another form of the lock mechanism is adopted in the second embodiment.

The lock mechanism in the second embodiment comprises a locking rod 204 that is fixedly connected to the outer frame 201 via a bracket. The interlock structure includes a latch 21 and a slider block 22 that are rotatably connected to the panel 202 and that are respectively provided with a corresponding return spring (not shown in the drawings). The latch 21 has a similar structure and function to those of the latch 120 in the first embodiment. The slider block 22 has a similar structure and function to those of the locking hook 130 in the first embodiment, except that the whole slider block 22 or at least an end of the slider block 22 that is not provided with the hook portion, namely an end opposite to the end provided with the hook portion, is made of magnetic material such as iron or steel, and when unlocking, a magnet is placed outside of the panel 202 to attract the slider block 22 to rotate so as to achieve the unlocking.

During installation, after the V-shaped hook is snapped by the V-shaped groove, the panel 202 is pressed down in the direction of the arrow C1 and then is rotated so as to make the upper lock mechanism locked. During disassembly, the lock mechanism is unlocked at first, and then the upper end of the panel 202 is rotated away from the outer frame 201, and then the panel 202 is lifted obliquely upwards in the direction of the arrow C2 so as to be separated from the outer frame 201.

As shown in FIG. 11c, the upper end of the outer frame 201 has a respective socket 241 that may be a data outlet or a power outlet, and although not shown, the upper end of the panel 202 has a corresponding plug to achieve an electrical connection with the socket 241. In order to stabilize the connection between the socket and the plug, as a preferred embodiment, the socket and the plug may have an opposite magnet respectively, and the magnets attract each other, thereby improving the reliability of the connection thereof.

The differences between the first and second embodiments lie in that, firstly, the rotatable connection between the lower ends of the outer frame and of the panel is slightly different; secondly, the specific structure of the lock mechanism adopted at the upper ends of the outer frame and of the panel is different. Both of them have similar effects, but the second embodiment is more convenient and simpler due to the use of a non-contact unlocking manner.

The outer frame in the present embodiment can be mounted in a similar manner to that in the first embodiment. That is to say, it can be positioned exactly by providing corresponding positioning members at the four sides of the outer frame, or by providing the positioning holes in the outer frame, that is, by positioning the adjacent outer frames using the mounting fixture having positioning pins, the dimension between which is determined according to design requirements.

Third Embodiment

Figure 13:
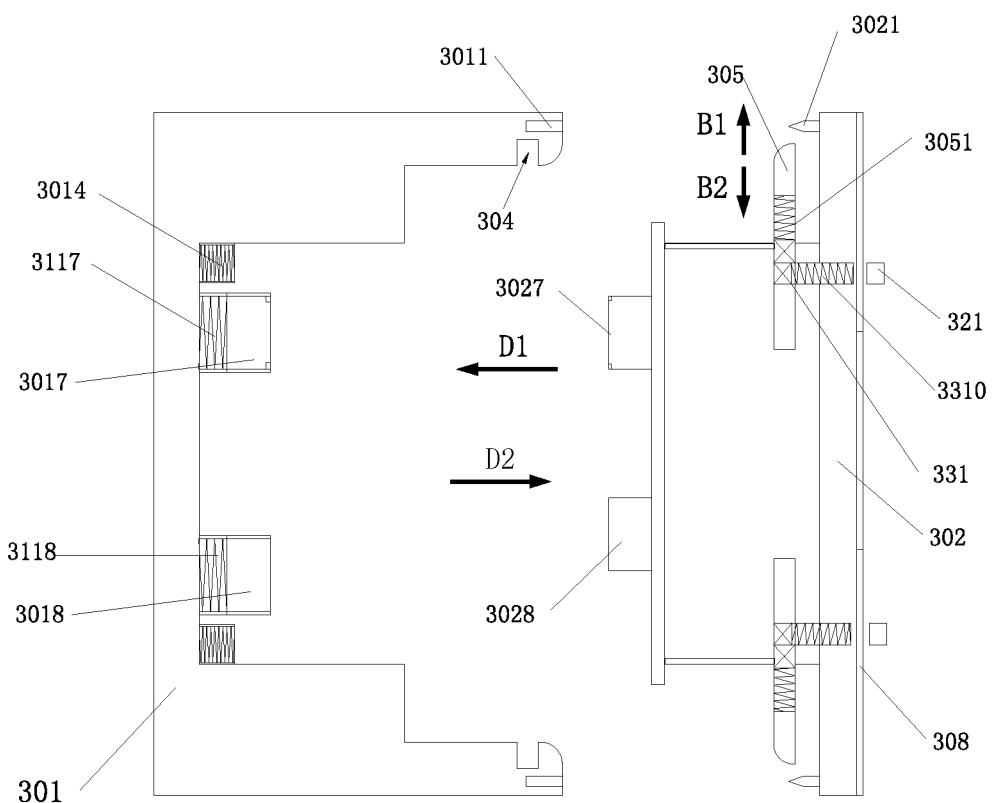
FIG. 13 is a side view of the mounting structure for a display screen in an exploded state according to a third embodiment of the present invention.
Figure 14:
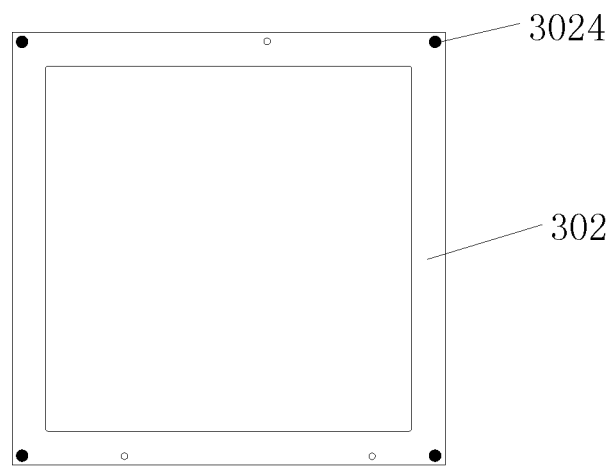
FIG. 14 is a front view of the panel in the third embodiment of the present invention.

FIG. 13 is a side view of the mounting structure for a display screen in an exploded state according to a third embodiment of the present invention. FIG. 14 is a front view of the outer frame of the mounting structure for a display screen according to the third embodiment of the present invention.

As shown in FIG. 13, in the third embodiment, the panel 302 during disassembly or installation is moved into and out of the outer frame 301 in parallel thereto, and the side of the outer frame 301 and the opposite side of the panel 302 are fixedly connected to each other by the lock mechanism. Since the panel 302 is moved into and out of the outer frame 301 in parallel thereto, in order to achieve the accurate positioning, the side of the outer frame 301 facing the panel 302 is provided with one or more positioning holes 3011 that are preferably distributed in an asymmetric manner for better positioning. A plurality of corresponding positioning columns or pins 3021 are provided on the panel 302.

In this embodiment, the lock mechanism comprises a lockhole 304 that is respectively provided in the upper end and the lower end of the outer frame in the vertical direction, and a tongue that is provided at the inner side of the panel and is movable in the up and down direction. When the panel approaches the outer frame in parallel thereto, the tongue and the side of the lockhole in contact with the tongue 305 are smoothly curved respectively, and in the opened state as shown in FIG. 13, the tongue 305 under the action of the return spring is in the extended position, and when the tongue 305 enters the lockhole 304, the tongue 305 under the action of the return spring is also in the extended position, so that the tongue 305 is located in the lockhole 304 and the panel 302 is fixedly connected to the outer frame 301, that is, the lock mechanism is in a locked state. The installation may be understood with reference to FIG. 13. When the panel 302 approaches the outer frame 301 in the direction of arrow D1, the end of the tongue 305 and the front end of the lockhole 304 abut against each other so as to press the tongue 305 to be retracted in the direction of arrow B2, and when the tongue 305 reaches the position of the lockhole 304, the tongue 305 under the action of the return spring 3051 is pressed to extend along the direction of arrow B1 into the lockhole 304 to form a retaining state with the lockhole. At this time, the power plug 3027 or the date plug 3028 within the panel 302 is connected to the power socket 3017 or the data socket 3018 provided on the base end of the outer frame 301 respectively, and the display screen 308 after being powered on displays the related information. In order to improve the reliability of connection of the socket and the plug, as shown in FIG. 13, a first spring 3117 is provided between the power socket 3017 and the outer frame 301, a second spring 3118 is provided between the data socket 3018 and the outer frame 301, and the force of the first spring 3117 and the second spring 3118 makes more reliable connection between the socket and the plug.

In case of detaching the panel 302, the tongue 305 is forced by external force to retract in the direction of arrow B2 and then the panel 302 is translated in the direction of arrow D2, and when the panel 302 is moved out of the outer frame 301, the external force is withdrawn and the tongue 305 can be restored in the direction of the arrow B1 under the action of the return spring to a position as shown in FIG. 13. The external force can be obtained by a toggle lever provided on the panel 302, which drives the tongue 305 to move up and down against the elastic force of the return spring and thus exit from the lockhole 304. Of course, any other structure may be provided. For example, the tongue 305 is made of magnetic material, and an electromagnet is provided at the other end of the tongue 305 to attract the tongue 305 to move up and down, wherein when the electromagnet is energized, the tongue 305 is retracted by the attraction between the electromagnet and the tongue 305, and when the electromagnet is de-energized, the tongue is restored under the action of the return spring. In sum, a structure that enables the tongue 305 to move up and down can achieve the purpose of the present invention. For example, in FIG. 13, when a magnet 321 is used to contact the respective position of the panel, the slide block 331 under the action of the magnet is moved rightwards in the figure and compresses the spring 3310. As the slide block 331 moves rightwards, the return spring 3051 makes the tongue 305 move out of the lockhole 304, and thus the unlocking is achieved.

More specifically, in the present embodiment, in order to facilitate unlocking, the base of outer frame 301 is provided with an unlocking spring 3014. When the panel 302 and the outer frame 301 are connected in the locked state, the unlocking spring 3014 is in a compressed state subject to an external force, and when the tongue 305 is retracted from the lockhole 304, the unlocking spring 3014 automatically pop the panel 302 out, and it is apparent that the spring force of the unlocking spring 3014 should not be too large.

The outer frame 301 may be in a regular shape, preferably rectangular, hexagonal, triangular, and the most preferably rectangular. The outer frame 301 includes one or more stiffening ribs to strengthen the outer frame so as to be not easily deformed. Each side of the outer frame 301 has one or more positioning pins for precise positioning. Each side of the outer frame 301 has one or more fixing bolts for fixing the outer frame to the other outer frames, or fixing the outer frame to a bracket or a building surface. There may be one or more outer frames 301 to form a matrix shape, each outer frame being connected to the adjacent outer frame(s).

The outer frame 301 is generally made of steel. As shown in FIG. 14, in this embodiment, the four corners of the panel 302 are respectively embedded with an electromagnet 3024, and when the power plug is connected to the power socket, the power source is turned on by the electromagnets which are tightly adsorbed on the outer frame 301; and so on, the panel 302 of each cabinet is tightly adsorbed on the corresponding outer frame 301 of the cabinet, ensuring the flatness of the cabinet panels.

With the solution in this embodiment, during the installation, there is only one action of pushing the panel 302 into the outer frame 301 to complete the installation. During the detachment, once the tongue 305 is forced by an external force to be retracted, the panel 302 can be popped slightly out of the outer frame 301. Because of the special structure of the present embodiment, the installation process can be performed by any non-professional person with no tool.

The outer frame 301 in the present embodiment can be mounted in a similar manner to that in the first embodiment. That is to say, it can be positioned exactly by providing corresponding positioning members at the four sides of the outer frame, or by providing the positioning holes 3011 in the outer frame 301, that is, by positioning the adjacent outer frames using the mounting fixture having positioning pins, the dimension between which is determined according to design requirements.

Compared with the above first and second embodiments, the present embodiment has advantage of easier and more convenient installation and disassembly. There is only one action of pushing the panel into the outer frame during installation, and only two actions are needed to detach the panel during maintenance. Installation and disassembly of the panel can be completed with no tool.

Figure 15:
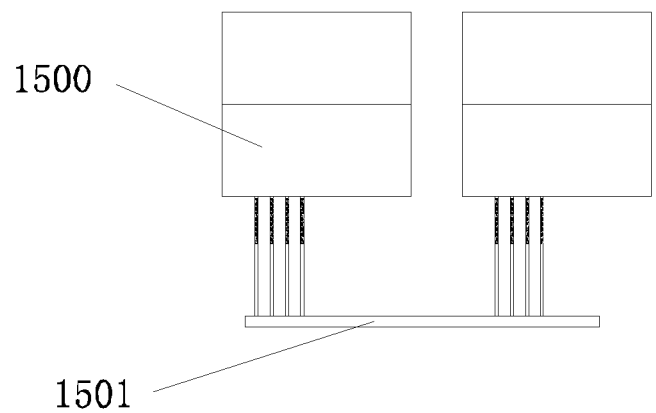
FIG. 15 is a schematic structural view of the connection of data cables of display units in the third embodiment of the present invention.

As shown in FIG. 15, in order to reduce the number of the connection of data and power and plugs of the display screen, in this embodiment, a prior art HUB plate and a control card are integrated into a PCB board 1501, which reduces the number of 40-pin plugs for connecting the HUB and the control card. The display unit 1500 is welded to the PCB board 1501 having integrated the functions of the control card and HUB plate, which further reduces the number of the plugs. Meanwhile, the display units 1500 are all connected to the PCB board 1501 through data connection, while there is no data connection between the display units 1500, which reduces the number of the 100-pin plugs. Similarly, the display unit and the power source (the power plug of the present embodiment) also have a welded connection therebetween, which reduces the number of 8-pin plugs. Thus, the number of data plugs and power plugs of the cabinet is greatly reduced, facilitating the installation and removal.

And, data connection may be either contact connection or non-contact connection. The socket and the plug may have a direct contact connection through the pin needles, or have a non-contact wireless connection via Bluetooth, WIFI, infrared, magnetic sensors, etc. The socket and the plug respectively have a built-in magnet, and the magnets tightly attract when the socket and the plug are close so as to improve the reliability of the data connection.

Furthermore, in this embodiment, a hollow space is formed between the panel 302 and the outer frame 301 of the cabinet, facilitating the heat dissipation. Of course, the outer frame 301 is preferably made of aluminum alloy material with good heat dissipation performance, and the power lock shell, the cabinet and the cabinet outer frame constitute the overall aluminum alloy heat dissipating system.

As can be seen from the work process of the present embodiment described above, detaching the panel can be done from the front, and the front installation and maintenance can be operated by non-professionals. The installation or maintenance of the cabinet can be completed quickly by only two actions.

Fourth Embodiment

Figure 16:
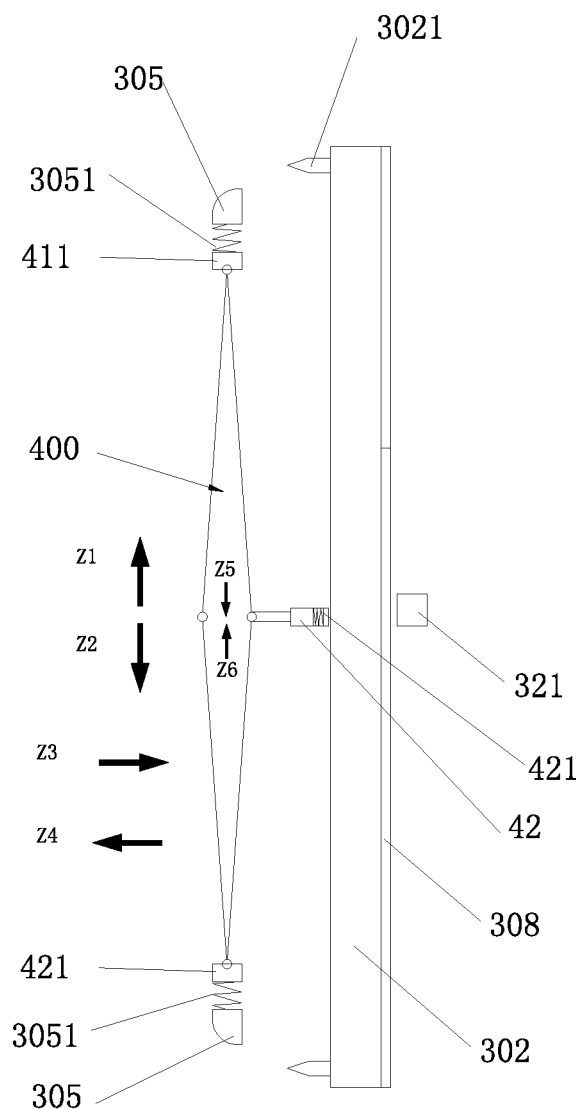
FIG. 16 is a side view of the panel of the mounting structure for a display screen according to a fourth embodiment of the present invention.
Figure 17:
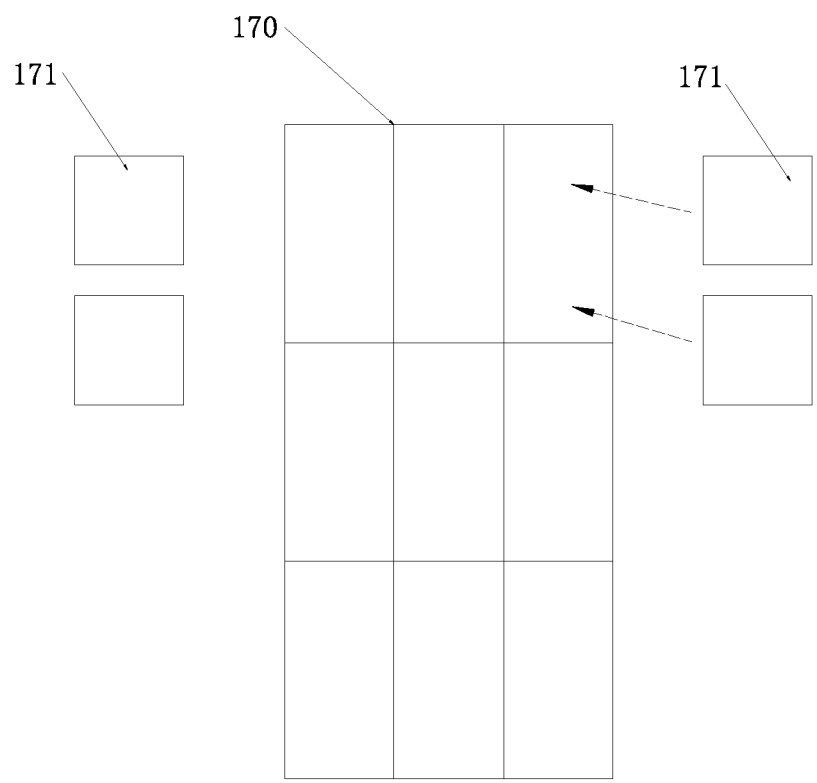
FIG. 17 is a schematic structural view of the connection of a prior art cabinet and metal structure.
Figure 18:
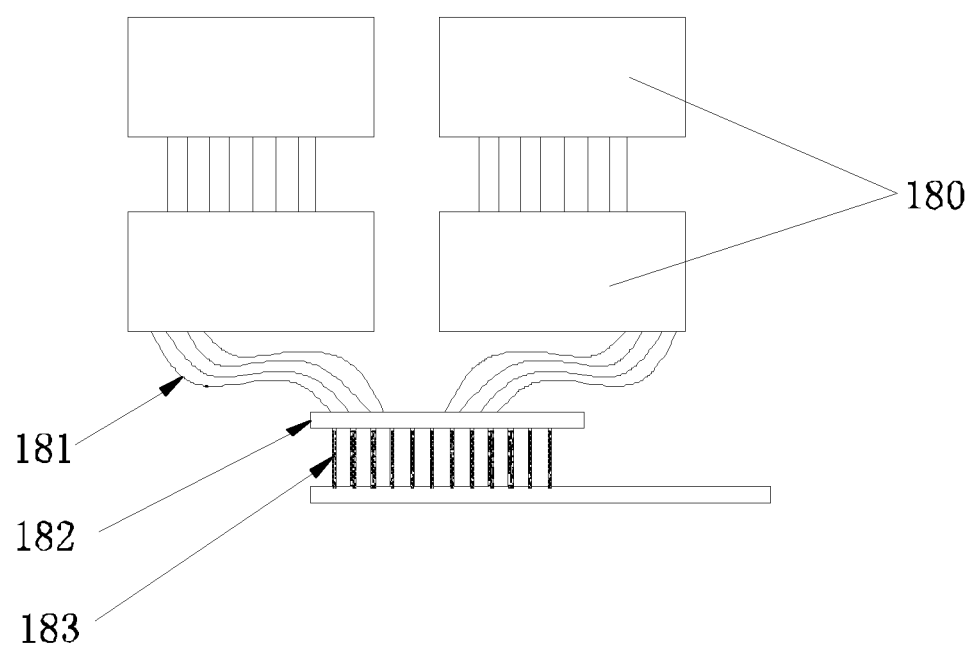
FIG. 18 is a schematic structural view of the connection of data cables of display units in the prior art.

FIG. 16 is a side view of the panel of the mounting structure for a display screen according to a fourth embodiment of the present invention. The outer frame of the mounting structure for a display screen in the fourth embodiment has the same configuration as that in the third embodiment, and the panel has the substantial same configuration as that in the third embodiment, the difference mainly lies in a different structure for extending or retracting the tongue.

As shown in FIG. 16, in this embodiment, a hinge 400 of parallelogram having a pivot point at each of its four vertexes is adopted to achieve the extension and retraction of the tongue. The other end of the return spring 3051 of each tongue 305 is provided with one first slider block 411. The upper vertex and lower vertex of the parallelogram are respectively provided with the first slider block 411, the left vertex of the parallelogram is fixed to the base surface of the outer frame, and the right vertex thereof is provided on a horizontal slider block 42 that is horizontally movable and that is provided on the back of the panel 402. The horizontal slider block 42 is made of magnetic material, and apparently a return spring 421 is provided between the horizontal slider block 42 and the panel 302. Referring to FIGS. 16 and 13, during installation, the panel 302 is pushed towards the outer frame 301 in parallel thereon along the direction of arrow Z4. When the tongues 305 are blocked by the front ends of the lock holes 304, the tongues 305 compress the upper and lower first slider blocks 411 through the return springs 3051 respectively such that a distance between the upper and lower vertexes becomes small, that is, the upper vertex moving along arrow Z5 direction and the lower vertex along arrow Z6 direction, and the tongues 305 are retracted. And, when the tongues 305 are aligned with the lockholes 304 respectively, the tongues 305 under the action of the return springs 3051 are deeply inserted into the lockholes 304 respectively so as to drive the upper and lower vertexes to move in the opposite directions, that is, the upper vertex moving along arrow Z1 direction and the lower vertex along arrow Z2 direction, and the hinge 400 urges a distance between the left and right vertexes to be small, and at this time the tongue 305 is located within the respective lockhole 304 in a locked state. During disassembly, a magnet or electromagnet is placed outside of the display screen 480 to attract the horizontal slider block to displace horizontally toward the panel, that is to move in the direction of the arrow Z3 of FIG. 16, so that the distance between the left and right vertexes increases, and the distance between the upper and lower vertexes also increases due to the pulling of the hinge, the upper vertex moving along arrow Z5 direction and the lower vertex along arrow Z6 direction, thereby the upper and lower tongues 305 being retracted and exiting from the lockhole 304, and then the panel 302 can be translated outwards and removed. After the panel 302 is removed from the outer frame 301, the magnet is removed, and the horizontal slider block 42 under the action of the return spring 421 is translated towards the direction away from the panel 302, so that the distance between the left and right vertexes decreases, and the upper and lower vertexes are pushed by the hinge 400 such that the distance therebetween increases, and therefore the tongue 305 is restored.

Compared with the third embodiment, the structure in the fourth embodiment is simpler, in which the parallelogram hinge 400 is used to make the tongue 305 in and out of the lockhole 304, whereby enabling easy and quick installation or removal of the panel.

Of course, the foregoing descriptions are preferred embodiments of the present invention. It should be noted that many improvements and modifications may be made by one of ordinary skill in the art, without departing the principle of the present invention, which are also falling within the scope of the present invention.

I claim:

1. A mounting structure for a display screen, comprising:
a cabinet being comprised of: an outer frame; and a panel connected to the outer frame,
wherein said outer frame is connected to the panel through a lock mechanism in a locked state and is separated from the panel when the lock mechanism is opened,
wherein lower ends of the outer frame and of the panel are rotatably connected to each other, and upper ends thereof are fixedly connected to each other through the lock mechanism,
wherein the lower end of the outer frame is provided with a V-shaped groove, the lower end of the panel is provided with a corresponding V-shaped hook, and a plane in which the V-shaped groove lies is perpendicular to a plane in which the V-shaped hook lies such that a rotatable snap connection is formed by the V-shaped groove and the V-shaped hook,
wherein the lock mechanism comprises:
a locking rod fixedly connected to the upper end of the outer frame;
a locking box fixedly connected to the upper end of the panel; and
a slide channel that the locking rod can enter is opened at a side of the locking box facing the outer frame,
wherein the locking box has an interlock means comprised of a latch and a locking hook for locking the latch,
wherein the latch and the locking hook are rotatably connected to the locking box and are respectively provided with a return spring,
wherein the latch comprises a first tongue and a second tongue that form a U-shape opening for receiving the locking rod entering the slide channel, wherein, in the opened state, the first and the second tongues respectively coincide with an edges of the slide channel, and as the panel is rotated toward the outer frame, the locking rod enters the U-shaped opening and abuts against the first tongue so as to rotate the latch, wherein an end of the locking hook that is rotatably connected to the locking box is a connecting portion and another end thereof is a hook portion; an inner side of the hook portion and an outer side of the second tongue are retaining surfaces that are mutually retained; when the panel is connected to the outer frame, the hook portion is abutted against the outer side of the second tongue, thus preventing the latch containing the locking rod from rotating in a direction of releasing the locking rod, and wherein an outer side of the first tongue, an inner side of the second tongue and an outer side of the hook portion are smoothly curved so as to prevent the hook portion from interference with the first and the second tongues during the locking.

2. The mounting structure for a display screen according to claim 1, further comprising: a key being comprised of a key rod, a tapered head at the leading end of the key rod and a boss adjacent said tapered head that protrudes from the key rod such that a step is formed between the boss and the key rod, and an operating handle is at a trailing end of the key rod; a lockhole is provided on a lock shell such that the key after the insertion can contact the connecting portion of the locking hook; and a projecting ratchet having a radial retaining surface is provided on the connecting portion of the looking hook; after the key is inserted into the lockhole, the boss is caught on the radial retaining surface of the ratchet, and pulling the key can rotate the locking hook so as to achieve the unlocking.

3. The mounting structure for a display screen according to claim 2, further comprising: an anti-drop structure for preventing the key from automatically dropping that includes a chuck particular to the key; and a surface at an inner end of said chuck facing a direction of the keyhole is a slope surface, and an opposite surface at an inner end of the chuck is a flat surface, wherein the chuck is wound with a chuck spring for returning which makes the chuck extend so that the flat surface at the inner end of the chuck abuts against the boss of the key, thus preventing the key from exiting outwards, and an outer end of the chuck projects out of the lock shell and is provided with a chuck handle.

4. The mounting structure for a display screen according to claim 1, further comprising: an elastic pad that acts on the outer side of the first tongue in the locked state.

* * * * *